United States Patent [19]
Kakumu et al.

[11] Patent Number: 5,847,412
[45] Date of Patent: Dec. 8, 1998

[54] SEMICONDUCTOR DEVICE AND A METHOD FOR MANUFACTURING THE SAME

[75] Inventors: Masakazu Kakumu, Yokohama; Masaaki Kinugawa, Tokyo, both of Japan

[73] Assignee: Kabushiki Kaisha Toshiba, Kawasaki, Japan

[21] Appl. No.: 867,984

[22] Filed: Jun. 3, 1997

Related U.S. Application Data

[60] Continuation of Ser. No. 638,504, Apr. 26, 1996, abandoned, which is a division of Ser. No. 629,039, Dec. 19, 1990, abandoned, which is a continuation of Ser. No. 272,990, Sep. 12, 1988, abandoned.

[30] Foreign Application Priority Data

| Sep. 18, 1987 | [JP] | Japan | ................................. 62-233931 |
| Sep. 18, 1987 | [JP] | Japan | ................................. 62-233933 |
| Feb. 3, 1988 | [JP] | Japan | ................................. 63-23006 |

[51] Int. Cl.⁶ .......................... H01L 29/76; H01L 29/94; H01L 27/11

[52] U.S. Cl. .......................... 257/66; 257/380; 257/903; 257/904

[58] Field of Search ............................ 257/66, 903, 904, 257/350, 380

[56] References Cited

U.S. PATENT DOCUMENTS

| 4,489,478 | 12/1984 | Sakurai | .................................... 257/350 |
| 5,087,956 | 2/1992 | Ikeda et al. | ............................. 257/904 |

OTHER PUBLICATIONS

Dennison et al., "A Novel MOS Device Structure with S/D Contacts Over Oxide (COO)," *IEDM 85*, pp. 204–207.

*Primary Examiner*—Steven H. Loke
*Attorney, Agent, or Firm*—Finnegan, Henderson, Farabow, Garrett & Dunner, L.L.P.

[57] ABSTRACT

A plurality of silicon insulating films are formed to separate regions to be formed with elements from each other on a silicon semiconductor substrate. Silicon layers are formed by an epitaxially growing method on the regions to be formed with the elements and the silicon insulating film. An MOS transistor is formed on the monocrystalline silicon layer formed on the regions to be formed with the elements of the silicon layer, and the polysilicon layer formed on the silicon insulating film is used as a high resistance element or doped with an impurity as a conductor line.

1 Claim, 12 Drawing Sheets

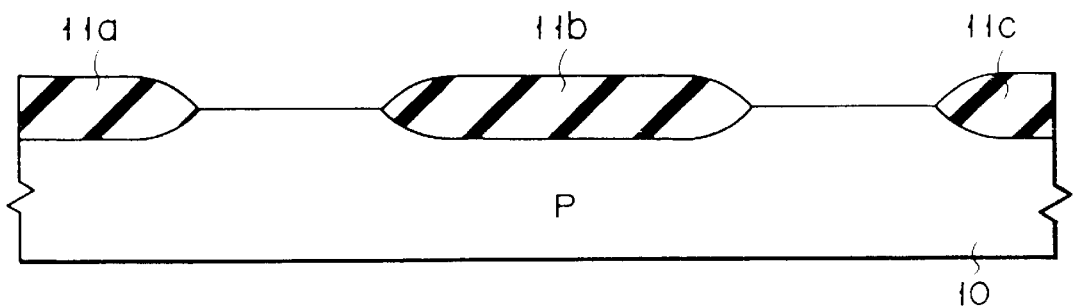
F I G. 1A
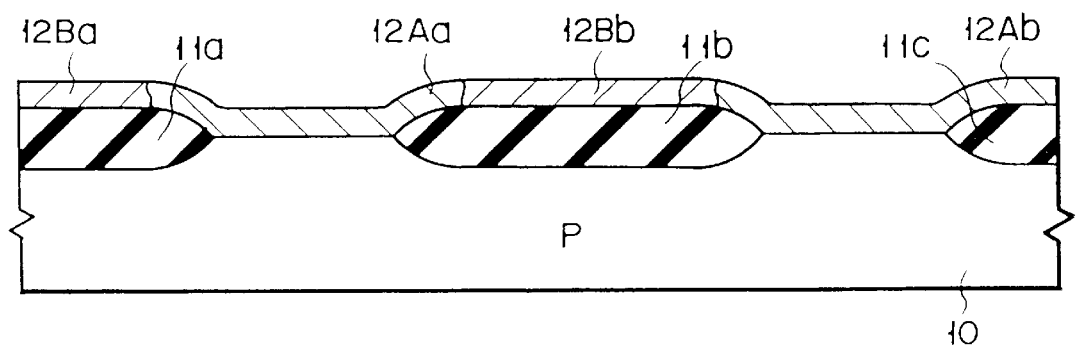
F I G. 1B
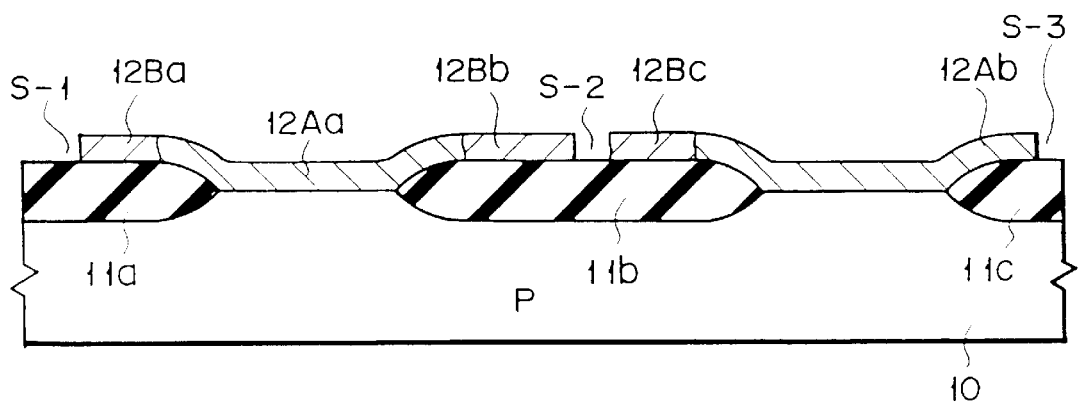
F I G. 1C

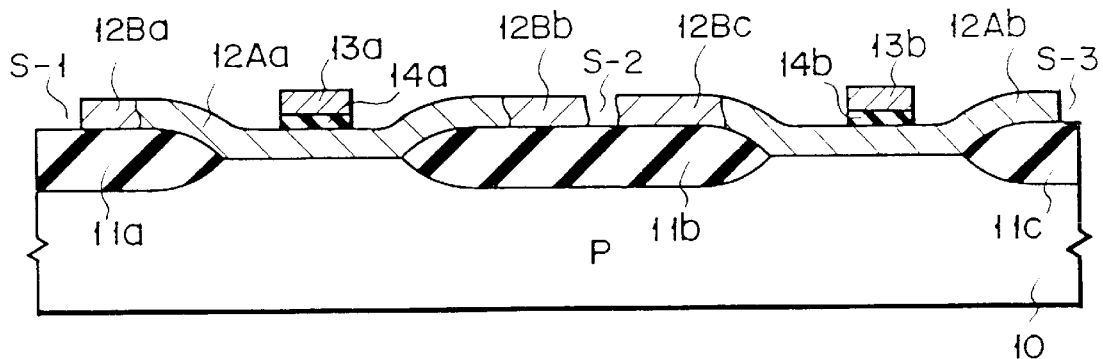
F I G. 1D
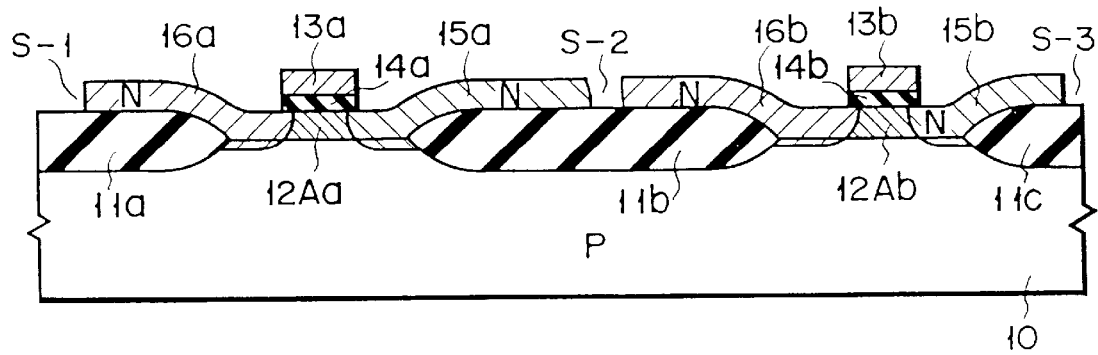
F I G. 1E
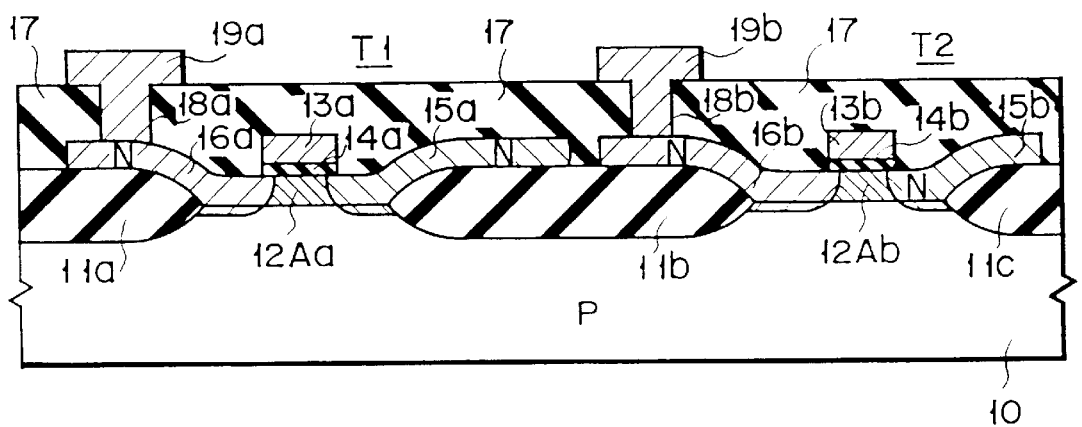
F I G. 1F

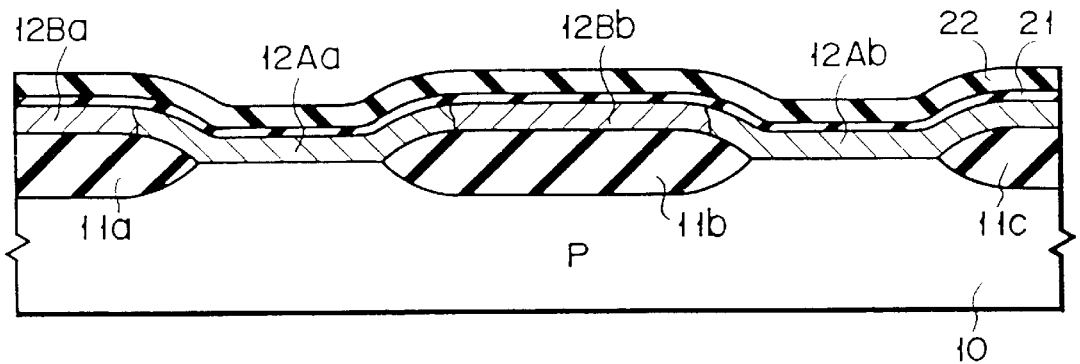
F I G. 2A
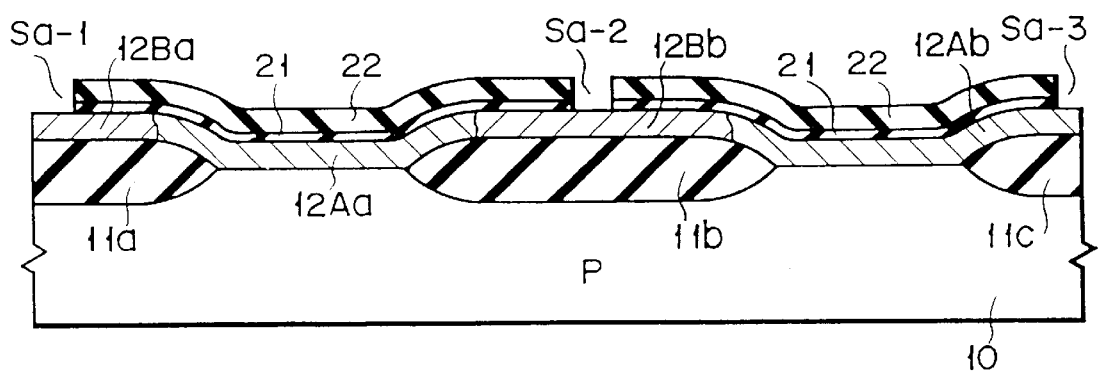
F I G. 2B
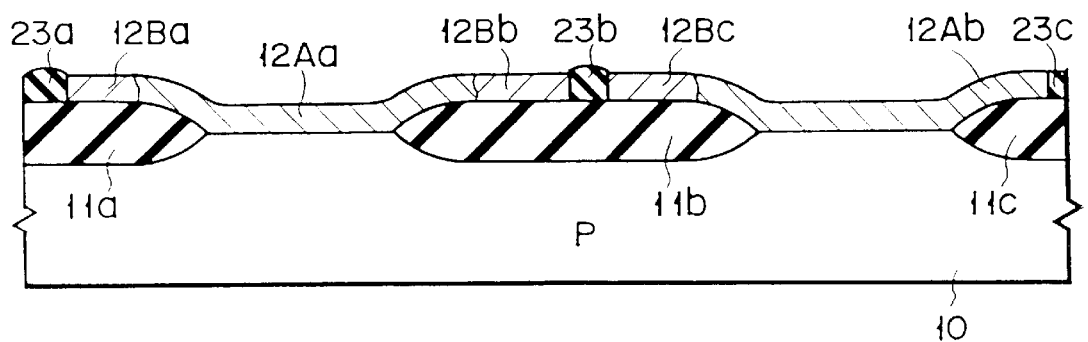
F I G. 2C

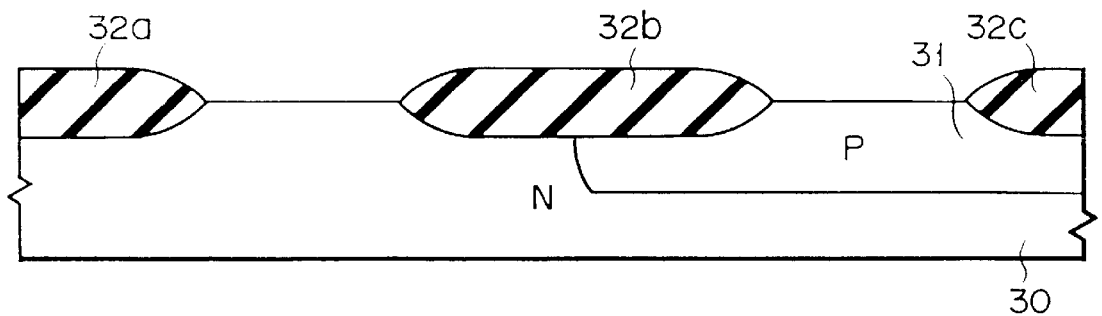
F I G. 3A
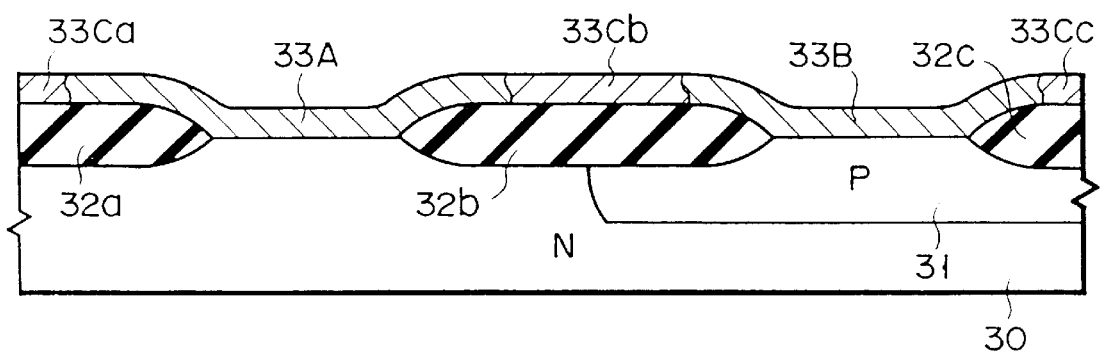
F I G. 3B
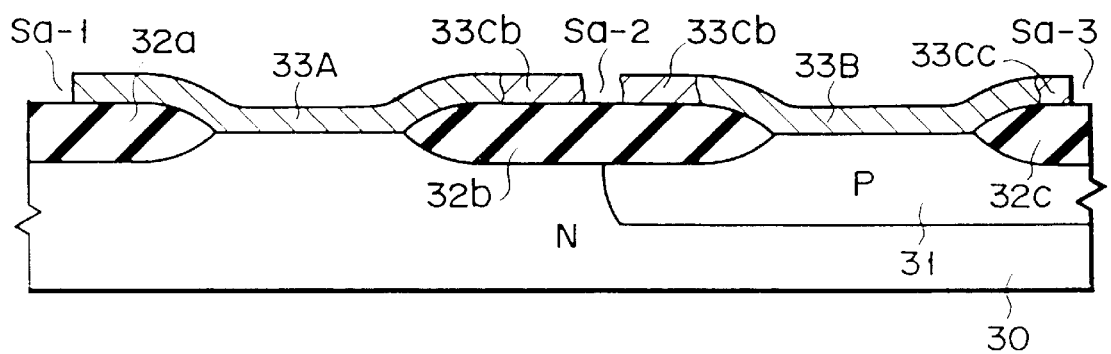
F I G. 3C

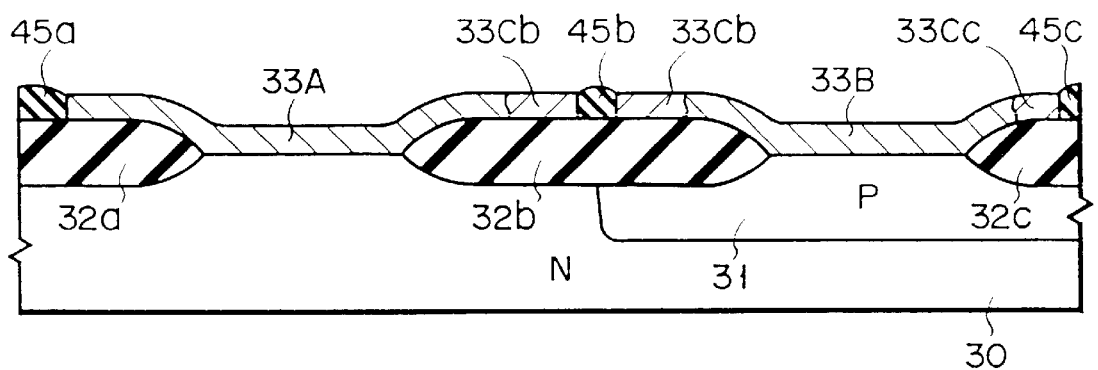
F I G. 4
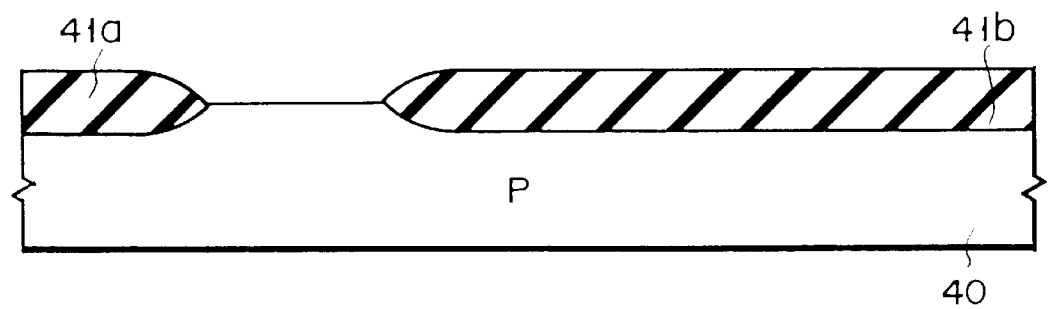
F I G. 5A
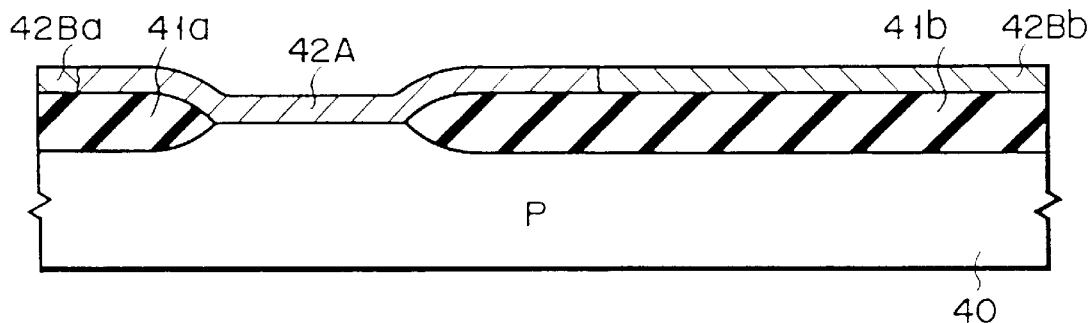
F I G. 5B
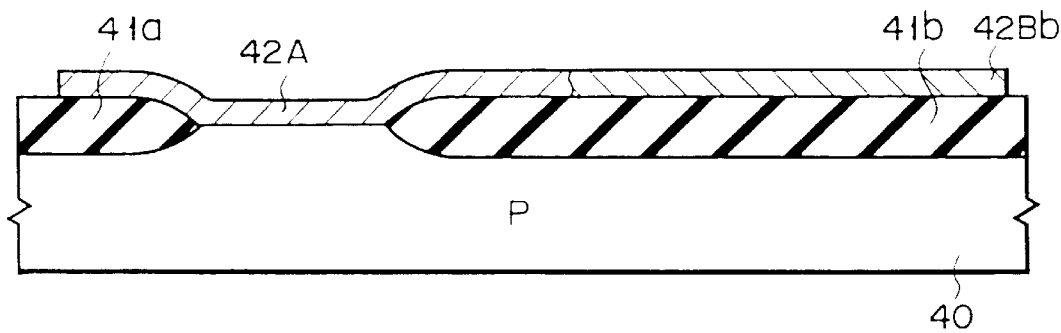
F I G. 5C

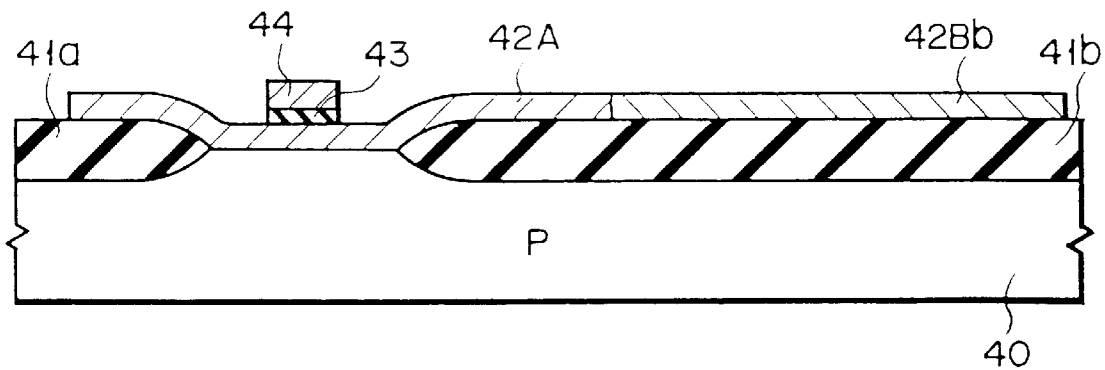
F I G. 5D
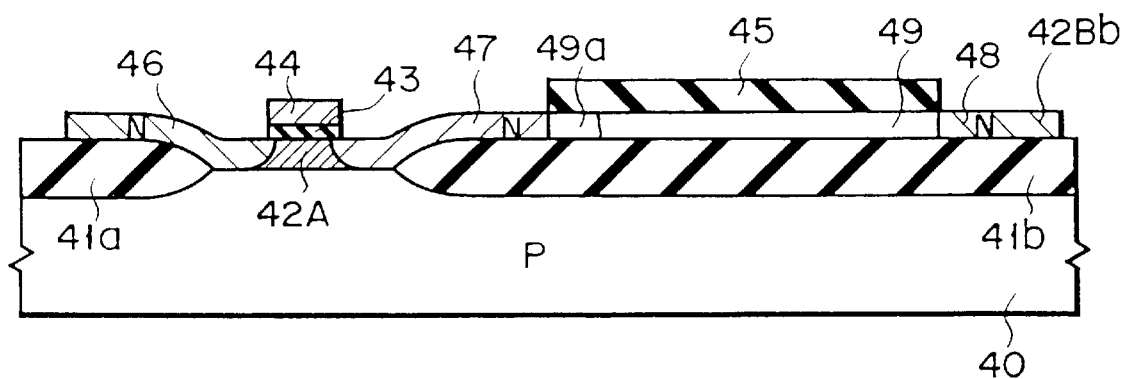
F I G. 5E
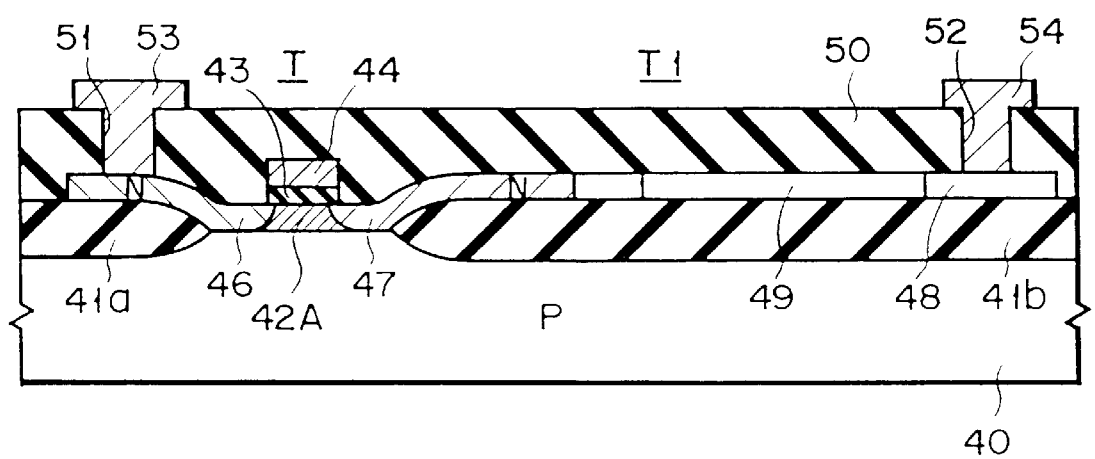
F I G. 5F

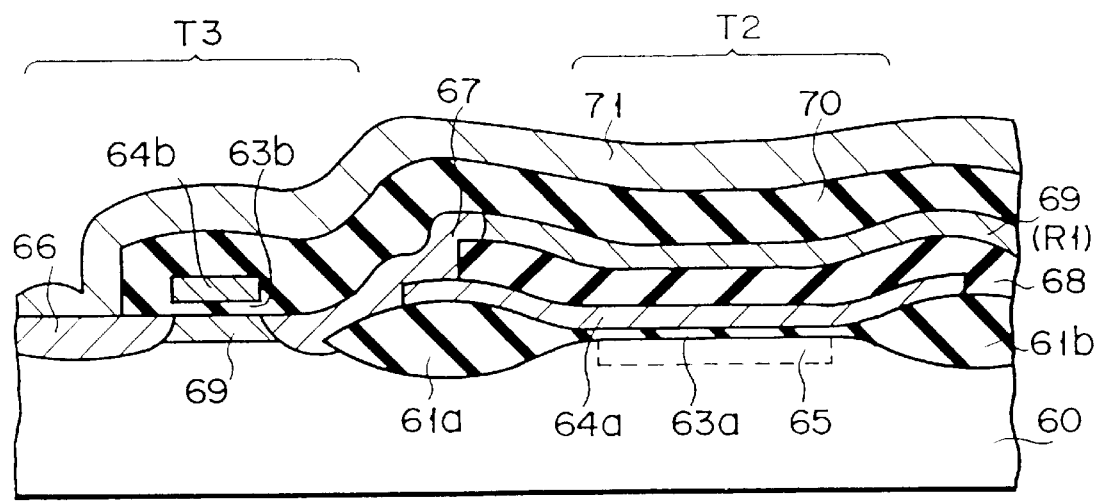
F I G. 8
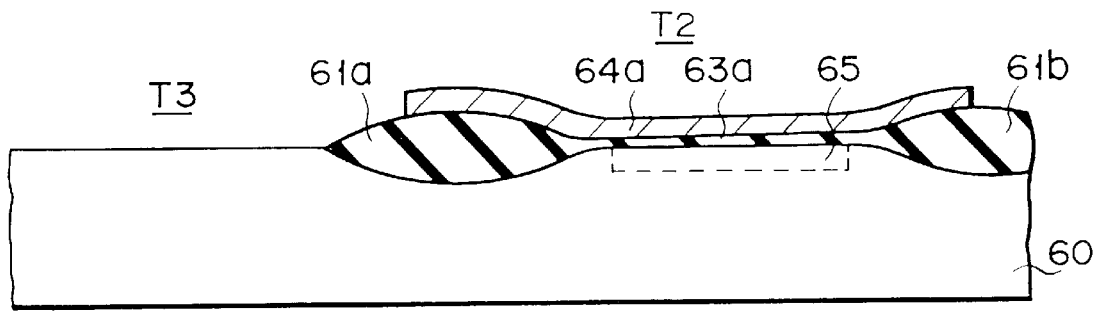
F I G. 9A
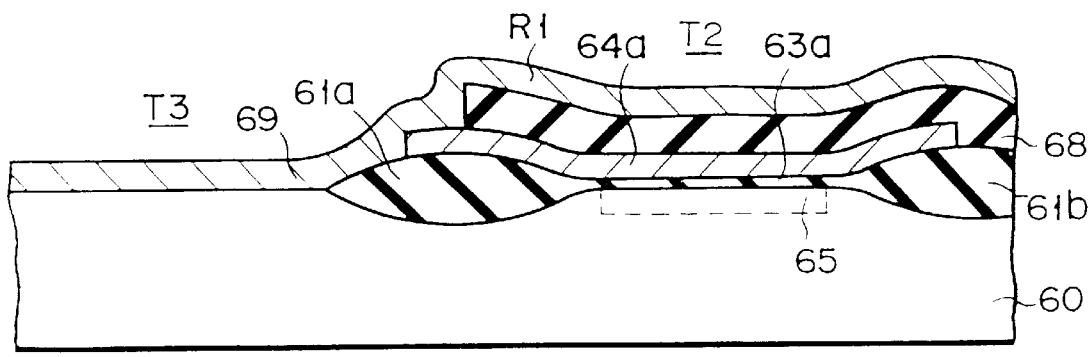
F I G. 9B

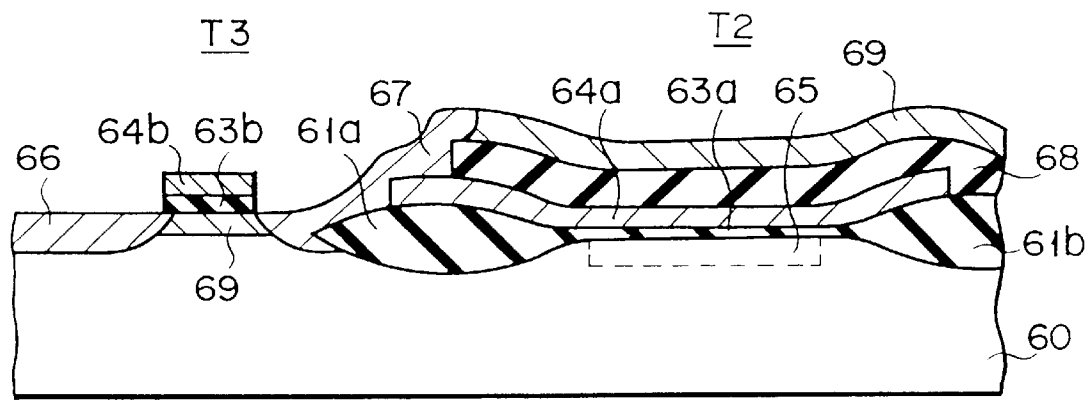
F I G. 9C
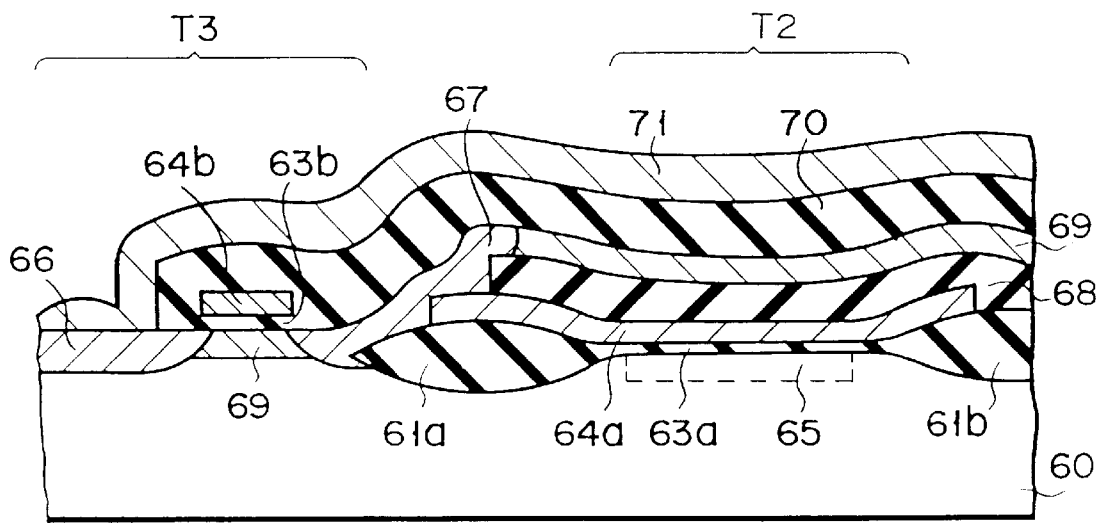
F I G. 9D

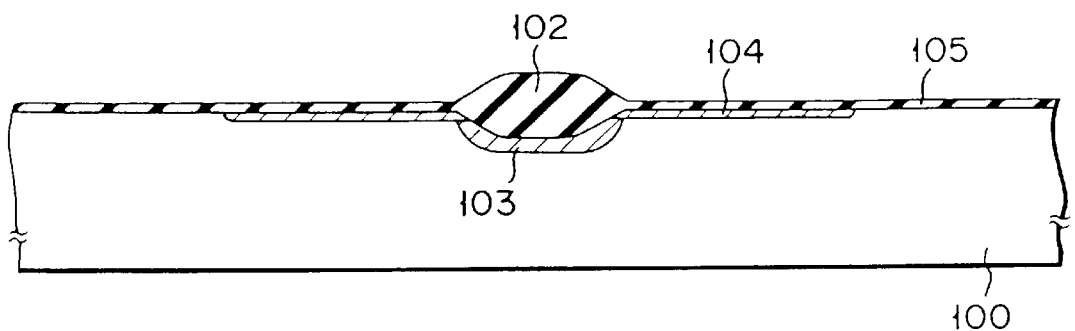
F I G. 10A
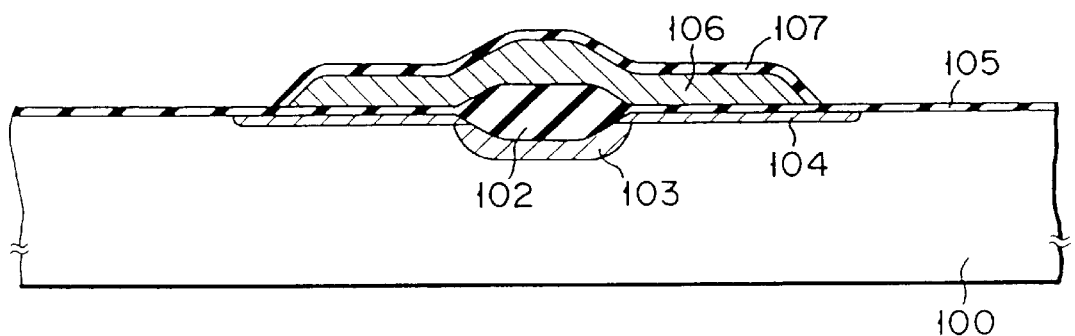
F I G. 10B
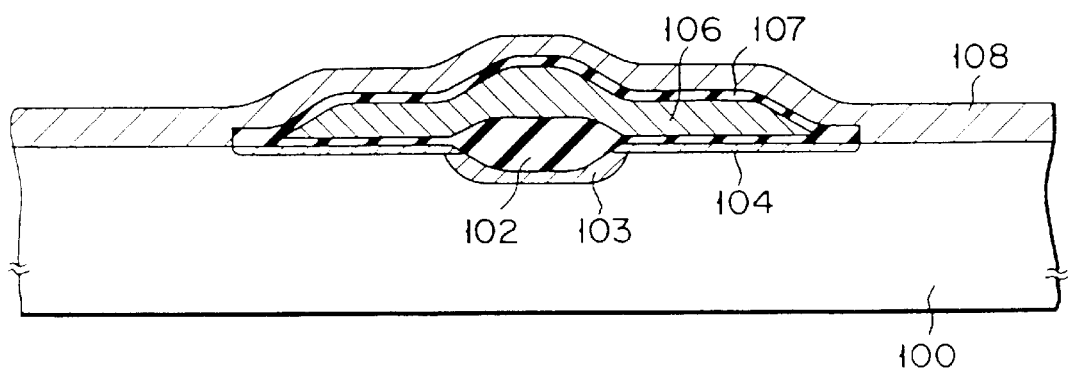
F I G. 10C

SEMICONDUCTOR DEVICE AND A METHOD FOR MANUFACTURING THE SAME

This application is a continuation of application Ser. No. 08/638,504 filed Apr. 26, 1996, now abandoned; which was a division of application Ser. No. 07/629,039 filed Dec. 19, 1990 now abandoned; which was a continuation of application Ser. No. 07/242,990, filed Sep. 12, 1988 now abandoned.

BACKGROUND OF THE INVENTION

1. Field of the Invention

This invention relates to a semiconductor device having semiconductor elements separated by an element separating region formed on a semiconductor substrate and a method for manufacturing the same.

2. Description of the Related Art

When a number of elements are formed on a semiconductor substrate, the elements must be separated from each other. An LOCOS method and a BOX method are wellknown as such an element separating technique.

The LOCOS method forms a thick insulating film for separating elements on a semiconductor substrate by forming an antioxidation film, such as a silicon nitride film ($Si_3N_4$ film) through an insulating film on the substrate, patterning it, and selectively oxidizing it with the silicon nitride film as a mask.

The other BOX method forms a buried insulating film for separating elements on a semiconductor substrate by forming a silicon nitride film through a protective film of the substrate surface on the substrate or forming a silicon nitride film directly on the substrate, patterning it, then selectively forming a groove on the substrate by anisotropic etching technique with the silicon nitride film or a silicon oxide film as a mask, removing the silicon nitride film or the silicon oxide film used as the mask, then depositing the insulating film thereon, then retaining the insulating film only in the groove by an anisotropic etching technique and removing the others.

According to the former LOCOS method, an error occurs in size between the masking material of the substrate, such as the silicon nitride film and the insulating film formed for separating elements. For example, the silicon nitride film is 2500 Angstroms thick, the insulating film (the silicon oxide film) between the semiconductor substrate (silicon substrate) and the silicon nitride film is 1500 Angstroms thick, the insulating film for separating elements at the selective oxidation time is 8000 Angstroms thick and the formed insulating film for separating the elements are 5000 to 6000 Angstroms thick, the dimensional error becomes 1.2 micron to 1.6 micron. Thus, in order to obtain the thick insulating film for separating the elements to sufficiently satisfy electric characteristics by the LOCOS method, the limit of the width of the practical element separating region is approx. 2.0 microns, and the LOCOS method has such a drawback that it cannot separate finer elements than 2.0 microns.

It has been experimentally confirmed that there is a predetermined relationship between the width of the element separating region and the thickness of the insulating film formed for separating the elements. According to this, when the width of the element separating region is narrowed, there arises a problem that its thickness is reduced to scarcely obtain sufficient electric element separability. For example, when the width of the insulating film for separating the elements formed under the conditions of the thickness described above is 1.4 micron, the obtained maximum thickness of the insulating film for separating the element is approx. 3000 to 3200 Angstroms by considering a crystal defect in the semiconductor substrate, and the formation of the film thickness more than this is difficult. The thickness of the insulating film for separating the elements depends upon the relationship between the thickness and the impurity concentration of an inversion preventive layer formed under the insulating film. The more the impurity concentration is, the thinner the thickness of the insulating film becomes, but the excessively high impurity concentration of the inversion preventive layer causes the withstand voltage of the element and the operating speed to be deteriorated, and is disadvantageous in the formation of the elements.

The BOX method forms the groove in the semiconductor substrate with the silicon nitride film or the silicon oxide film as a mask, and buries the insulating film in the groove to form an element separating region. However, this method forms the element separating region according to the mask member forming size and can increase the depth of the groove to that capable of obtaining sufficient electric separating characteristic. Thus, this BOX method is advantageous to form the narrow element separating region. However, since there is no difference of the width of the center of the groove and the thickness of the insulating film directly after the deposition of the flat portion of the substrate according to a groove burying method which utilizes the difference of a stepped portion near the groove due to the sequential conductions of the deposition of the insulating film and an anisotropic etching and the insulating film of the flat portion except the stepped portion, it has such a drawback that this method is disadvantageous in the burial of the wide groove, i.e., in the formation of the wide element separating region.

As a method for burying a wide groove, there have been trially executed a method which has depositing an insulating film, then coating it with a resist member including low viscosity, flatten the uneven surface of a substrate and then anisotropically etching it, and a method which repeatedly repeats depositing an insulating film and anisotropically etching it. However, a defect occurs on the substrate, resulting in a difficulty. Further, this method increases the steps to be disadvantageous in cost.

A P-N separation by a well region is known as an element separating technique in a CMOS semiconductor device for forming both P-channel and N-channel MOS transistors on a semiconductor substrate. This method includes, for example, forming a P-well region on an N-type semiconductor substrate, and forming a P-channel MOS transistor on the substrate and an N-channel MOS transistor on the P-well region to form a CMOS transistor structure, thereby electrically separating both the transistors by the P-N junction. However, according to the method for separating by the P-N junction, as a distance between the P-channel MOS transistor and the N-channel MOS transistor becomes short, a parasitic bipolar transistor tends to be ON, thereby causing a latchup. In order to prevent such a latchup phenomenon, an impurity concentration in the substrate or the well region may be enhanced, but if the impurity concentration is increased, the substrate bias effect of the MOS transistor becomes vigorous, and it simultaneously becomes difficult to control the extension of the well region into the substrate. Therefore, the minimum distance between the $P^+$ type layer and the $N^{30}$ type layer which becomes the source and the drain of the P-channel and N-channel MOS transistors in the P-N junction separation is 5 microns.

A trench separating method has been recently proposed as another element separating technique in which a groove (trench) is dug on a substrate to bury the groove with an insulating film, such as a silicon oxide film to separate elements. This trench separating method has an advantage of increasing a latchup prevention strength, but has drawbacks that it is difficult to vertically dig the groove, if the width of the groove is narrowed, an insulating film is not sufficiently buried in the groove, and a stress is applied to the buried material to easily allow a defect to occur in the substrate.

As described above, the conventional element separating technique cannot satisfy simultaneously both the drawback of the dimensional error and the formation of the wide element separating region, and causes a latchup in the CMOS semiconductor device.

SUMMARY OF THE INVENTION

The first object of this invention is to provide a semiconductor device and a method for manufacturing the same which can reduce the dimensional error of an element separating region, form a wide element separating region and prevent a latchup in case of a CMOS semiconductor device.

The second object of this invention is to provide a semiconductor device and a method for manufacturing the same which can miniaturize a high resistance element connected to a semiconductor element formed in an element separating region and is simple in manufacturing steps.

The third object of this invention is to provide a semiconductor device and a method for manufacturing the same which can reduce the area of a semiconductor memory cell formed in a region separated by an element separating region and obtain a stable circuit operation.

In order to achieve the objects, the semiconductor device of this invention comprises a silicon semiconductor substrate, an insulting film selectively formed on the substrate for separating elements and a silicon layer formed continuously on the substrate not covered with the insulating film and on the insulating film formed on the substrate.

In order to further achieve the objects, the method for manufacturing the semiconductor device of this invention comprises the steps of: forming an insulating film for separating elements on a silicon semiconductor substrate, depositing the silicon layer on the substrate by means of an epitaxial growing method, and separating the silicon layer at each region to be formed with the element.

This invention provides an MOS transistor on each element forming region by separating elements by an LOCOS method, then depositing a silicon layer on the entire surface under the conditions that at the exposed surface of the silicon semiconductor substrate and the periphery thereof the silicon layer is epitaxially grown, then separating the silicon layer at each element forming region.

In this case, the elements are electrically separated by separating the silicon layers on the insulating film for separating the elements. Thus, the dimensional error of the separating region becomes extremely small, and a wide element separating region can be freely formed. Further, even when the CMOS transistor is formed, a latchup does not easily occur like a conventional method for separating elements by a P-N junction, and a defect does not occur on the substrate like a conventional trench groove method.

According to one aspect of a semiconductor device of this invention, there is provided a semiconductor device comprising a silicon semiconductor substrate, an insulating film selectively formed on the substrate for separating elements, a silicon layer formed continuously over the substrate not covered with the insulating film and over the insulating film, source, drain regions of an MOS transistor formed partly in the silicon layer by being introduced with an impurity thereto, gate insulating film and gate electrode of the MOS transistor formed between the source, drain regions, and a high resistance region formed partly in the silicon layer connected to the drain region.

According to another aspect of a method for manufacturing a semiconductor device of this invention, there is provided a method for manufacturing the semiconductor device comprising the steps of: forming an insulating film for separating elements on a silicon semiconductor substrate, growing a silicon layer on the substrate by means of an epitaxial growing method, separating the silicon layer at each region to be formed with the element, forming a gate insulating film and a gate electrode on the separated silicon layer, and introducing an impurity partly to the separated silicon layer to form source, drain and contact regions and to form a high resistance region on a portion not introduced with the impurity.

According to the one aspect of the semiconductor device of this invention, the source and drain regions of the MOS transistor are formed on the monocrystalline silicon region in the silicon layer formed on the silicon semiconductor substrate, the high resistance region is formed on the polycrystalline silicon region thereof, and the contact region of the high resistance region is formed on the monocrystalline silicon region. Since the contact region of the high resistance region is formed on the monocrystalline silicon region, even if an impurity is doped, an ion dozing amount can be reduced, thereby precisely determining the size of the high resistance region.

According to the other aspect of the method for manufacturing the semiconductor device of this invention, the driver transistor of the memory cell is formed in the element separating region, an interlayer insulating film is then formed partly except the gate electrode of this transistor, and silicon is epitaxially grown on the transfer gate forming region (semiconductor substrate) the element separating oxide film, the exposed portion of the gate electrode and the interlayer insulating film. In this case, the monocrystalline silicon layer is grown on the transfer gate forming region, and the polycrystalline silicon layer is grown on the other portion. Then, the transfer gate is formed on the monocrystalline silicon layer.

According to the constitution and the manufacturing method of the present invention described above, the transfer gate element region and the high resistance load element are formed of the same epitaxial layer. Therefore, it is not necessary to form a buried contact. Thus, this invention can prevent a leakage due to the etching of the substrate, and reduce the cell area. Since the driver transistor and the transfer gate are formed in the separate steps, the gate insulating films of different thicknesses can be formed, thereby freely setting the a ratio of the two transistors and minimizing the increase in the, cell area.

BRIEF DESCRIPTION OF THE DRAWINGS

FIGS. 1A to 1F are sectional views sequentially showing the manufacturing steps according to an embodiment of this invention;

FIGS. 2A to 2C are sectional views showing the steps of modified embodiment of FIGS. 1A to 1F;

FIGS. 3A to 3F are sectional views sequentially showing the manufacturing steps of a semiconductor device of another embodiment according to this invention;

FIG. 4 is a sectional view showing one step of a modified embodiment of FIGS. 3A to 3F;

FIGS. 5A to 5F are sectional views sequentially showing the manufacturing steps of still another embodiment of a semiconductor device of this invention;

FIG. 8 is a sectional view of a semiconductor memory of the other embodiment of this invention;

FIGS. 9A to 9D are sectional views sequentially showing a method for manufacturing a semiconductor memory shown in FIG. 8; and FIGS. 10A to 10E show sectional views of manufacturing steps of a further embodiment of the invention.

DETAILED DESCRIPTION OF THE PREFERRED EMBODIMENTS

Figure 3D:
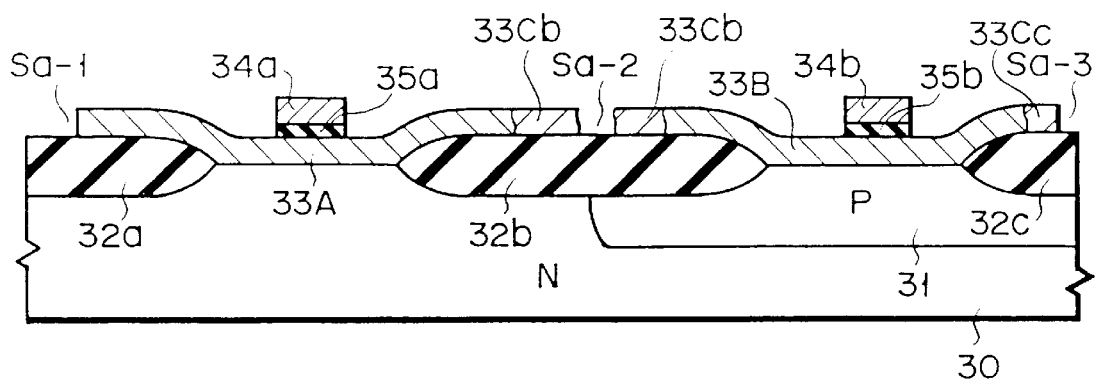

An embodiment of the semiconductor device according to this invention will now be described with reference to the drawings.

FIG. 1A to FIG. 1F are sectional views sequentially showing the steps of a manufacturing method when this invention is applied to a semiconductor device having a plurality of N-channel MOS transistors. In FIG. 1A, field oxide film 11 for separating elements of, for example, 0.6 micron thick is formed by a selective oxidation by a known normal LOCOS method on P-type silicon substrate 10.

Then, a silicon layer of 0.4 micron thick is deposited on the exposed surface of silicon substrate 10 by a CVD (Chemical Vapor Phase Depositing method) under the conditions that a monocrystalline silicon layer is epitaxially grown. In this case, silicon layers 12A formed on the exposed surface of silicon substrate 10 and the periphery of the exposed surface have good crystallinity of the epitaxial layers to become monocrystalline silicon layer those of silicon substrate 10. Further, the portion of silicon layer apart from the exposed surface of silicon substrate 10, i.e., silicon layer 12B on field oxide layer 11 becomes a polycrystalline silicon (FIG. 1B).

Then, silicon layers 12A$a$, 12B$a$, 12B$b$, 12A$b$, 12B$c$ are patterned by a selectively etching method to selectively retain the silicon layers only on regions to be formed with elements, other portions S-1, S-2, S-3 are removed, and patterned as shown, for example, in FIG. 1C.

The silicon layers retained in this step become those for forming wirings, resistors, capacitors to be formed between elements, such as MOS transistors in future, but in the foregoing description, only the case that the MOS transistors are formed on the regions to be formed with elements will be described for the convenience of description.

Then, a silicon oxide film is formed, for example, 20 nm thick on the entire surface, and a polycrystalline silicon layer is further deposited, for example, 0.4 micron thick thereon. Thereafter, both the films are patterned by a lithographic technique to selectively form gate electrodes 13$a$ and 13$b$ made of the polycrystalline silicon layers and gate insulating films 14$a$, 14$b$ made of the silicon oxide films on the silicon layers 12A$a$, 12A$b$ of the regions to be formed with elements (FIG. 1D).

Subsequently, with gate electrodes 13$a$, 13$b$ as masks arsenic As is ion implanted, for example, in acceleration energy of 40 keV and dose of $5 \times 10^{15} cm^2$ as an N-type impurity on silicon layers 13A$a$, 12A$b$, 12B$a$ to 12B$c$ of the regions to be formed with elements to be activated. Thus, N-type source regions 15$a$, 15$b$ and drain regions 16A, 16B are formed on silicon layers 12A$a$, 12A$b$, 12B$a$ to 12B$c$ of the regions to be formed with elements (FIG. 1E).

Thereafter, interlayer insulating film 17 of BPSG (boron-phosphorus-silicon-glass) film is deposited 1.0 micron thick on the entire surface, contact holes 18$a$, 18$b$ are opened at interlayer insulating film 17, a metal film of aluminum or the like is further deposited by a vacuum depositing method on the whole surface, and patterned to form drain electrodes 19$a$, 19$b$ connected to drain regions 16$a$, 16$b$ of MOS transistors, thereby completing the semiconductor device having a plurality of N-channel MOS transistors T1, T2 (FIG. 1F).

According to this method described above, the minimum separating width in the separation of the elements is determined according to the size in case of patterning the patterns of silicon layers 12A$a$, 12B$a$, 12B$b$ or 12A$b$, 12B$c$ in principle in the step in FIG. 1C. For example, even in case of the technique capable of patterning 0.8 micron thick, the conventional LOCOS method can separate up to 1.4 micron at the least. However, in this embodiment, the width of the interval S-1 between the pattern 12B$b$ and 12B$c$ can be 0.8 micron. If the lithographic technique and the etching technique are advanced in future, the separating width can be correspondingly narrowed to be adapted for a high density miniaturization.

In the semiconductor device manufactured as described above, transistors T1, T2 are separated Ay dielectric separation with interlayer insulating film 17. Therefore, a junction leakage current can be reduced. Further, since the areas of the source, drain diffused regions can be reduced as compared with the conventional device, its operating speed can be accelerated. Since the contacts of drain electrodes 19$a$, 19$b$ are formed with silicon layers (drain regions 16$a$, 16$b$) formed on thick field oxide films 11$a$, 11$b$, it can prevent the punch-through of aluminum which is the problem in the conventional device, thereby effecting to reduce contact resistances.

FIG. 2A to FIG. 2C are sectional views showing the steps of midway of modified embodiment of the above-described embodiment of this invention. In the method of the embodiment in FIGS. 1A to 1F, the selectively etching method is employed as a method for separating silicon layers 12A$a$, 12B$a$, 12B$b$ from silicon layers 12A$b$, 12B$c$ at each region to be formed with elements. However, according to this method of the modified embodiment, the portion except the region to be formed with the elements is selectively oxidized to be separated. In FIGS. 2A to 2C, reference numerals indicate corresponding numerals as those in FIGS. 1A to 1F. That is, silicon oxide film 21 and silicon nitride film ($Si_3N_4$) 22 are sequentially deposited after the step in FIG. 1B (FIG. 2A).

Then, the laminated film made of silicon oxide film 21 and silicon nitride film 22 is patterned, the laminated film is selectively retained only on the regions to be formed with elements, the other portions corresponding to element separating grooves S-1 to S-3 of FIG. 1C are removed to form grooves Sa-1 to Sa-3 (FIG. 2B).

Thereafter, with patterned laminated films 21, 22 as masks the portion of silicon layer 12B$b$ is oxidized to form silicon oxide films 23$a$ to 23$c$ in groove Sa, and laminated films 21, 22 are then removed (FIG. 2C).

According to the separation with silicon oxide films 23$a$ to 23$c$ in accordance with selective oxidation, the substrate surface is flattened as compared with the semiconductor device manufactured according to the embodiment of the method in FIGS. 1A to 1F. Therefore, this embodiment can prevent metal electrodes and wirings formed on the substrate from being stepwisely disconnected.

FIGS. 3A to 3F show sectional views sequentially showing the steps of the manufacturing method of the case that this invention is applied to a CMOS semiconductor device having P-channel and N-channel MOS transistors. P-well region 31 is formed by the same method as the conventional method, for example, by a selectively diffusing method on N-type silicon substrate 30, and field oxide films 32a to 32c for separating elements of, for example, 0.6 micron thick are formed by the selective oxidation by normal LOCOS method (FIG. 3A).

Then, a silicon layer is deposited, for example, 0.4 micron thick on the entire surface of the exposed surface of silicon substrate 30 by a CVD (Chemical Vapor phase Deposition method) under the conditions that a monocrystalline silicon is epitaxially grown. In this case, silicon layers 33A formed on the exposed surface and the periphery thereof of N-type silicon substrate 30, and silicon layers 33B formed on the exposed surface and the periphery thereof of P-well region 31 have good crystallinity of the epitaxial layers similar to those of silicon substrate 30. Further, silicon layers 33Ca, 33Cb, 33Cc formed on the portions on field oxide film 32 become polycrystalline silicon (FIG. 3B).

Subsequently, silicon layers 33A, 33B, 33Ca to 33Cc are patterned by a selectively etching method to retain the silicon layers only on the regions to be formed with elements, the other portions are removed, and separating grooves Sa-1 to Sa-3 are formed (FIG. 3C).

Silicon layers 33A to 33Cc retained in these steps become regions for forming wirings, resistors and capacitors between elements of the MOS transistors, but in the foregoing description, the case that MOS transistors are formed on the regions to be formed with elements will be described as an example for the convenience of description.

Then, a silicon oxide film is formed, for example, 20 nm thick on the entire surface, and a polycrystalline silicon layer is further deposited, for example, 0.4 micron thick thereon. Thereafter, both the films are patterned by lithographic technique, and gate electrodes 34a, 34b made of polycrystalline silicon layer and gate insulating films 35a, 35b made of silicon oxide films are selectively formed on silicon layers 33A and 33B of the regions to be formed with elements (FIG. 3D).

Figure 3E:
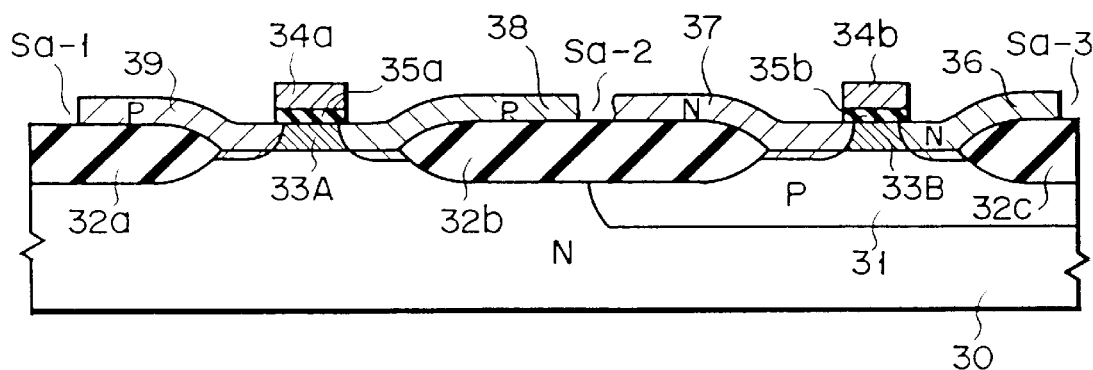
Figure 3F:
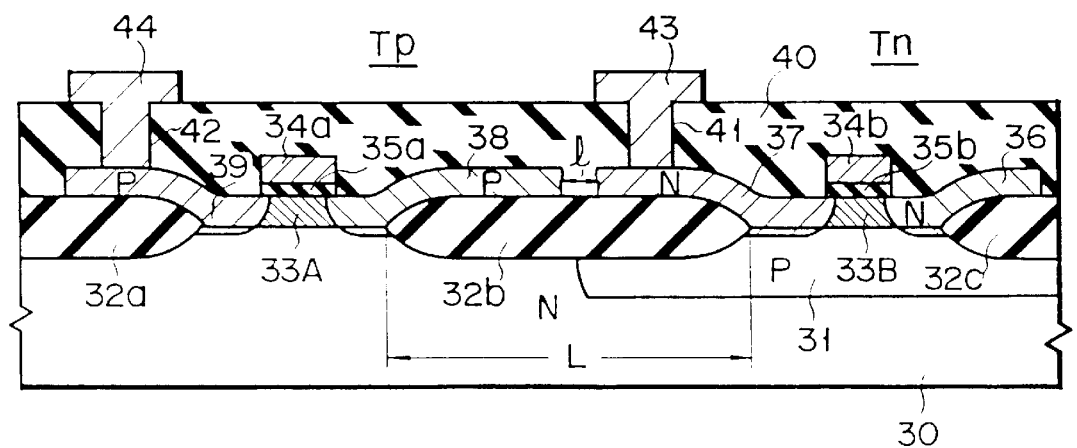

Subsequently, photoresist, not shown, is so formed by lithographic technique as to cover the portions on silicon substrate 30 except P-well region 31. Then, with gate electrode 34b as a mask arsenic As is ion implanted, for example, in acceleration energy of 40 keV and dose of $5 \times 10^{15}/cm^2$ as an N-type impurity on P-well region 31. Then, the photoresist is removed, photoresist, not shown, is then so formed in shape as to cover P-well region 31, with gate electrode 34a on silicon substrate 30 as a mask $BF_2$ is ion implanted, for example, in acceleration energy of 50 keV and dose of $5 \times 10^{15}/cm^2$ as a P-type impurity, and the ion implanted regions are activated. Thus, N-type source region 36 and drain region 37 are respectively formed on silicon layers 33B, 33Cb, 33Cc of the regions to be formed with elements, and P-type source region 38 and drain region 39 are respectively formed on silicon layers 33A, 34Cb (FIG. 3E).

Thereafter, interlayer insulating film 40, is BPSG (boron-phosphorus-silicon-glass) film is deposited 1.0 micron thick on the whole surface, contact holes 41, 42 are opened at interlayer insulating film 40, a metal film made of aluminum is further deposited on the entire surface, and patterned to drain electrode 43 connected to drain region 37 of N-channel MOS transistor and drain electrode 44 connected to drain region 39 of P-channel MOS transistor, thereby completing a CMOS semiconductor device having a plurality of CMOS transistors Tp, Tn.

The PN separating width of the conventional CMOS semiconductor device separated by the P-N is limited to approx. 2 microns. However, in the CMOS semiconductor device manufactured according to the embodiment of the method described above, parts of the diffused regions (drain region 37 and source region 38) of N-channel MOS transistor Tn and P-channel MOS transistor Tp are disposed on field oxide film 32b, and the nearest portions are dielectric-separated by interlayer insulating film 40. In such a structure, the size L of field oxide film 32b shown in FIG. 2F, i.e., the width of the P-N separation is the same as that of the conventional device. Accordingly, latchup characteristic of this device is entirely the same as that of the conventional device. On the other hand, the substantial separating width of P-channel and N-channel MOS transistors Tp, Tn is the width 1 corresponding to groove Sa-2 (FIG. 3E) shown in FIG. 3F. Assume, for example, that size L is 2 microns, the size 1 can be narrowed up to the limit of the processing technique, such as 0.8 micron. In the conventional well separation, it cannot be extremely reduced due to a latchup phenomenon. However, according to this embodiment described above, this problem can be avoided. In other words, even in this embodiment described above, separating width 1 can be narrowed, thereby adapting for high density miniaturization. Similarly to the case of the embodiment in FIGS. 1A to 1F, the area of the diffused region can be also reduced, thereby accelerating the operating speed.

FIG. 4 is a sectional view showing the steps in the midway of the method according to a modified embodiment of the embodiment in FIGS. 3A to 3F. The method of this embodiment is conducted by forming silicon oxide films 45a to 45c due to the selective oxidation of the separation of silicon layers at each region to be formed with elements similarly to oxide films 23a to 23c of the method of the modified embodiment of FIG. 2C.

In the embodiments described above, the example that the silicon layers are partly epitaxially grown has been described. However, this may be so deposited as to entirely epitaxially grow. In the embodiments described above, the case that the silicon layers are ion implanted to form only the source, drain regions of the MOS transistor has been described. However, this may form wirings, resistors or the electrodes of capacitors used to connect with other elements with the silicon layers.

According to this invention as described above, the dimensional error of the element separating regions can be reduced, the wide element separating region can be formed, and, in the CMOS semiconductor device, a latchup can be prevented in the semiconductor device and the method for manufacturing the same.

FIGS. 5A to 5F are sectional views sequentially showing the steps of a method for manufacturing a semiconductor device according to still another embodiment of this invention.

Field oxide films 41a, 41b for separating elements of, for example, approx. 0.6 micron are formed by a selective oxidation of normal LOCOS method on P-type silicon substrate 40 (FIG. 5A).

Then, silicon layers 42A, 42Ba, 42Bb are formed 0.4 micron thick entirely on the exposed surface of silicon substrate 40 by a CVD (Chemical Vapor Phase Depositing method) under the conditions that a monocrystalline silicon is epitaxially grown. In this case, silicon layers 42A formed on the exposed surface of silicon substrate 40 and the periphery thereof have good crystallinity of the epitaxial layers to become single crystals near those of silicon substrate 40. Further, silicon layers 42Ba, 42Bb of the portions separation from the exposed surface of silicon substrate 40 becomes a polycrystalline silicon (FIG. 5B).

Then, silicon layers 42A, 42Ba, 42Bb are patterned by a selectively etching method to selectively retain the silicon layers 42A, 42Bb only on regions to be formed with elements, other portions are removed (FIG. 5C). Silicon layers 42A, 42Bb retained in this step become regions for forming MOS transistor and high resistance element in future.

Then, a silicon oxide film is deposited 20 nm thick on the entire surface, and a polycrystalline silicon layer is further deposited, for example, 0.4 micron thick thereon. Thereafter, both the films are patterned by a lithographic technique to selectively form gate electrode 44 made of the polycrystalline silicon layer and gate insulating film 43 made of the silicon oxide film on the silicon layer 42A made of the monocrystalline silicon (FIG. 5D).

Then, mask 45 for ion implanting in a predetermined shape is formed by a photoetching method, and with mask 45 and gate layer 44, arsenic As is ion implanted, for example, in acceleration energy of 40 keV and dose of $5 \times 10^{15}/cm^2$ as an impurity on silicon layers 42A$m$ 42Bb to be activated. Thus, N-type source region 46 and drain region 47 are formed on monocrystalline silicon layer 42A, N-type contact region 48 is formed on silicon layer 42B made of polycrystalline silicon, and high resistance element 49 is formed on the part of silicon layer 42Bb not doped with tons under mask 45 (FIG. 5E). Here, drain region 47 is formed by ion implanting only monocrystalline silicon layer 42A, and mask 45 is so formed in shape as not to implant ions to adjacent polycrystalline silicon layer 42Bb.

Subsequently, after mask 45 is removed, interlayer insulating film 50 of BPSG (boron-phosphorus-silicon-glass) film is deposited 1.0 micron thick on the entire surface, contact holes 51, 52 are opened at interlayer insulating film 50, a metal film of aluminum or the like is further deposited by a vacuum depositing method on the whole surface, and patterned to form $V_{SS}$ wirings 42 connected to source region 46 and $V_{DD}$ wirings 54 connected to contact region 48, thereby completing a semiconductor device as an interval used in a static RAM made of MOS transistor T and high resistance element 49.

According to this method, though two polycrystalline silicon layers are heretofore required to manufacture an E/R type inverter, this can be realized by one polycrystalline silicon layer for gate electrode 44 of MOS transistor T. Thus, the manufacturing steps can be simplified as compared with the conventional method.

As apparent from FIG. 5E, part 49a of high resistance region 49 retains part of monocrystalline silicon layer 42A, impurity ions for forming drain region 47 of MOS transistor T are doped to single crystallized region 42A, and impurity ions are doped only to one end of silicon layer 42Bb made of polycrystalline silicon for forming contact region 48. Thus, the degree of disturbing the microminiaturization of high resistance element by abnormal diffusion of impurity in the polycrystalline silicon of the conventional art can be reduced by approx. half of the conventional method, thereby realizing the microminiaturization of high resistance element 49.

Further, since high resistance element 49 and drain region 47 of MOS transistor T can be continuously formed, the problem of contacts of both which is problem in the conventional method can be entirely eliminated.

Figure 6:
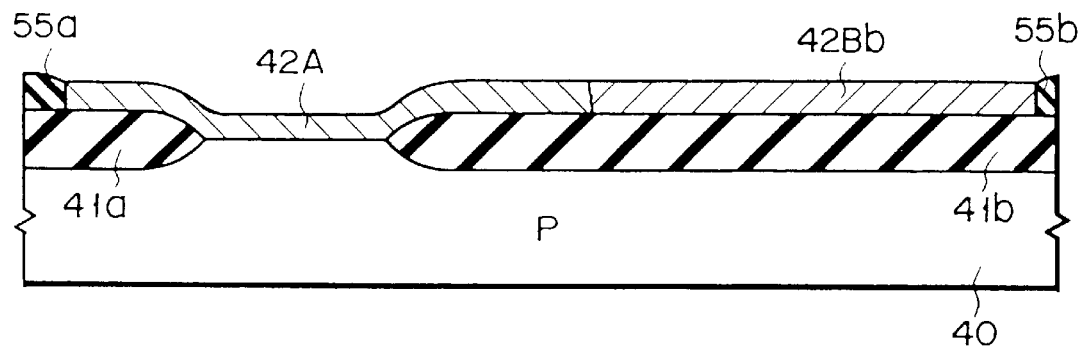
FIG. 6 is a sectional view showing one manufacturing step of still further embodiment of this invention.

FIG. 6 is a sectional view showing the steps of midway of still another embodiment of this invention. In the method of the embodiment, the case that the selectively etching method is employed in case of selectively retaining silicon layers 42A, 42Bb only on regions to be formed with elements has been described. This may separate, as shown in FIG. 6, by selective oxidation the portion except the regions to be formed with elements by means of silicon oxide films 55a, 55b. This method has been already described in detail with respect to FIGS. 2A to 2C, and the description will be omitted here. According to the separating method using silicon oxide films 55a, 55b by the selective oxidation as described above, the substrate surface is flattened as compared with the method of the embodiment in FIGS. 5A to 5F. Therefore, it can suppress stepwise disconnection of metal wirings formed thereon.

In the embodiment described above, the embodiment that the silicon layers are partly epitaxially grown has been described. This is preferable since, if it is entirely epitaxially grown, the portion of high resistance region 49 become higher resistance. Since activating energy becomes approx. 1.1 eV, a leakage current is reduced.

In embodiments in FIGS. 5A to 6 as described above, high resistance element 49 can be particularly miniaturized, and manufacturing steps are relatively simple.

Figure 7:
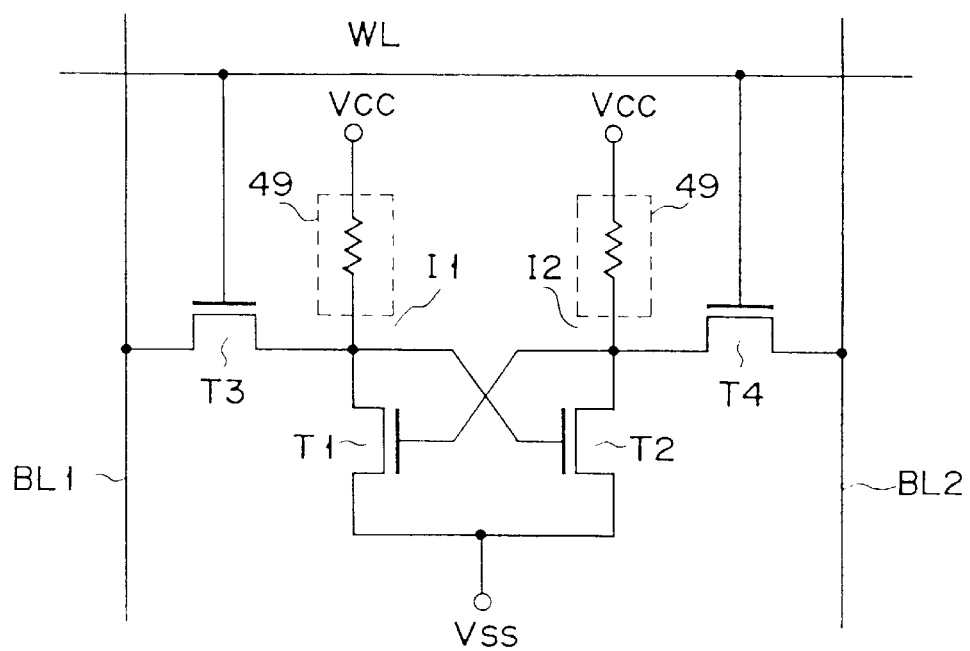
FIG. 7 is a circuit diagram of a memory cell having a high resistance load element.

FIG. 7 is a circuit diagram of a semiconductor device formed by the embodiment in FIG. 5F. In FIG. 5F, inverter I1 in which an enhancement type (E type) MOS transistor T for forming a memory cell used in a static RAM uses a driver transistor, and a pull-up high resistance element 49 uses its load element. In FIG. 5F, not shown, other inverter (I2 in FIG. 7) is formed in the same configuration as that of inverter I1 on substrate 40. As shown in FIG. 7, an E/R type memory cell circuit using two inverters is composed. In FIG. 7, the gates of transistors T of inverters I1, I2 are connected to the drains of transistors T of other inverters I2, I1 The sources of two transistors T are commonly connected to power source $V_{SS}$, and one end of load resistor 49 is connected to power source $V_{CC}$. The drains of transistors T1, T2 of inverters I1, I2 are respectively connected through transfer gates T3, T4 to bit lines BL1, BL2. The gates of the transistors of transfer gates T3, T4 are respectively connected to word lines WL. The structure of the inverter shown in FIG. 7 is shown in FIG. 5F, and the other portion of the circuit in FIG. 7 is the same as that of the memory cell of the normal static RAM, and, though the portion is not shown in FIG. 5F, it can be formed by a known method on substrate 40.

FIG. 8 is a sectional view showing part of the other side the cell of a static RAM of still another embodiment of this invention to construct part of the circuit in FIG. 7.

In FIG. 8, element separating oxide films 61a, 61b are formed on silicon substrate 60, two element regions T2, T3 separated by element separating oxide films 61a, 61b are provided. One of the element regions T1, T2 becomes a region for forming driver transistor T2, and the other becomes a region for forming transfer transistor T3. Diffused layer 65 is formed as a source or drain region on the surface region of substrate 60 in the region for forming driver transistor T2, and gate insulating film 63a is formed on substrate 60. Gate electrode 64a is formed over element separating oxide films 61a, 61b from gate insulating film 63a, and interlayer insulating film 68 is formed except part on gate electrode 64a. Silicon epitaxial layers 69 are formed on silicon substrate 60 of region for forming transfer transistor T3, element separating oxide films 61a, 61b, the exposed part of gate electrode 64a and interlayer insulating film 68. Epitaxial layer 69 is of a single crystal structure on silicon substrate 60, and of a polycrystalline structure on the region except the substrate. Part of epitaxial layer 69 of the polycrystalline structure operates as high resistance load element 49. Diffused layers (source region 66, drain region 67) are formed to be deeper in diffusing depth than epitaxial layer 69 in the region for forming transfer transistor T3. Gate insulating film 63b is formed on epitaxial layer 69, and gate electrode 64b is formed on gate insulating film 63b between source 66 and drain regions 67. Interlayer insulating film 70 is formed on the entire surface except an electrode lead, and metal wirings 71 are formed as bit line BL1 on interlayer insulating film 70. Metal wirings 71 are connected to source region 66 of transfer transistor T3.

According to this configuration, the element region of transfer transistor T3 and high resistance load element 49 are formed on same epitaxial layer 69. Thus, a buried contact is not required as the conventional device. Therefore, a leakage due to the etching of the substrate is eliminated, and the cell area can be reduced. Further, when source, drain regions 66, 67 are formed deeper than epitaxial layer 69, the decrease in the operation speed due to the increase in the junction capacity can be obviated. In addition, since the ratio β can be raised by regulating the thicknesses of gate insulating film 63b of transfer transistor T3 and gate insulating film 63a of driver transistor T2, a semiconductor memory in which a stable circuit operation can be obtained is provided even if cell area is not increased.

Then, the manufacturing steps of static RAM of the still another embodiment of this invention will be described in detail with reference to FIGS. 9A to 9D.

As shown in FIG. 9A, an n-well region is formed for a peripheral circuit on p-type (plane orientation 100) silicon substrate 60. Then, element separating oxide films 61a, 61b are formed, and two regions of p-type regions separated by element separating oxide films 61a, 61b are used as regions form forming driver transistor T2 and transfer transistor T3. An oxide film of approx. 100 Angstroms is grown on substrate 60 of a region for forming driver transistor T2 in 900° C. $O_2$ atmosphere to form gate insulating film 63a. Then, polycrystalline silicon layer is formed on the entire surface by a CVD depositing method, and phosphorus is thermally diffused with $POCl_3$. Thereafter, the polycrystalline silicon layer is patterned by photolithography and reactive ion etching to form gate electrode 64a over parts of gate insulating film 63a and element separating oxide films 61a, 61b. Further, in order to form diffused layer 65 as source or drain region of driver transistor T2, p-type MOS transistor forming region in n-well region is covered with a resist, and with gate electrode 64a as a mask $As^+$ ions are implanted under the conditions of 60 keV of accelerating voltage and $1\times10^{15}/cm^2$ of dose. In order to further form the source and drain regions of the p-type MOS transistor in the n-well, the n-type MOS transistor forming region in the p-type substrate is covered with the resist, and $BF_2^+$ ions are implanted under the conditions of 40 keV of accelerating voltage and $1\times10^{15}$ $cm^{-2}$ of doses. Then, after interlayer insulating film 68 is deposited on the entire surface, parts of regions for forming transfer transistor T3 and gate electrode 64a are removed. Then, silicon is epitaxially grown at 800° C. to become approx. 500 Angstroms thick on the whole surface to form epitaxial layer 69. Epitaxial layer 69 becomes a single crystal structure on silicon substrate 60, and a polycrystalline structure on the region except the substrate. Then, part of epitaxial layer 69 of the polycrystalline structure is patterned to form high resistance load element 49. Thereafter, as shown in FIG. 9C, an oxide film is grown approx. 200 Angstroms on epitaxial layer 69 in the region for forming transfer transistor T3 in 900° C. $O_2$ atmosphere to form gate oxide film 63b. Then, polycrystalline silicon layer is deposited by a CVD depositing method on the entire surface, and phosphorus is thermally diffused with $POCl_3$. Subsequently, the polycrystalline silicon layer is patterned by photolithography and reactive ion etching to form gate electrode 64b on gate insulating film 63b. Thereafter, in order to form diffused layers (source region 66 and drain region 67) on the regions for forming transfer transistor T3 and to make contact with gate electrode 64a with drain region 67, $As^+$ ions are implanted 60 kV of accelerating voltage and $1\times10^{16}$ $cm^{-2}$ of dose, and annealed. Then, as shown in FIG. 9D, interlayer insulating film 70 is formed, a contact hole is opened, and metal (aluminum) wirings 71 are formed as bit line BL.

According to the manufacturing method as described above, the steps of taking buried contact as the conventional method can be eliminated, thereby preventing a leakage caused thereby. Further, since gate insulating film 63b of transfer transistor T3 and gate insulating film 63a of driver transistor T2 are formed in separate steps, the ratio of transistors T2, T3 can be set by regulating the thicknesses of insulating films 63a, 63b. Therefore, the circuit operation can be stabilized while suppressing the increase in the cell area to the minimum limit.

Now, an embodiment which is applied the present invention to a dynamic random access memory (DRAM) will be described by referring to FIGS. 10A to 10E illustrating the respective manufacturing processes of the DRAM.

In FIG. 10A, a P-type silicon substrate 100 having a resistivity of 4 to 6 ohm.cm is first prepared. On this substrate 100, an element separating silicon oxide film 102 and a channel-stopping impurity region 103 provided between oxide film 102 and substrate 100 are formed. Next, at a surface portion of substrate 100 of a memory capacitor forming region, an n-type conductive layer 104 is formed for preventing the formation of an inversion region. After this process, an oxide film 105 for forming the memory capacitance is formed over the whole main surface of substrate 100 for a thickness of 10 nm.

In the process of FIG. 10B, on a portion of oxide film 105 corresponding to n-type conductive layer 104 is deposited a polysilicon layer 106. This polysilicon layer 106 is provided for a plate electrode of the memory capacitance, which is formed to have a thickness of 0.3 microns. Then, a second gate oxide film 107 is formed on the surface of plate electrode 106 for a thickness of 15 nm, for example. This second gate oxide film 107 may be formed of two or three layered structure of oxide and/or nitride films.

The remaining portion of oxide film 105 shown in FIG. 10B which does not face conductive layer 104 is then etched out to expose the surface of substrate 100. On the exposed surface of substrate 100 an epitaxial silicon layer 108 is formed under the condition in which an epitaxial silicon layer is grown. As a result, a first portion of silicon layer 108 epitaxially grown in contact with substrate 100 of monocrystalline silicon and a second portion closely formed to the first portion are formed as a monocrystalline silicon layer. The third portion of epitaxial silicon layer formed on element isolation oxide film 102 has a polysilicon structure.

Figure 10D:
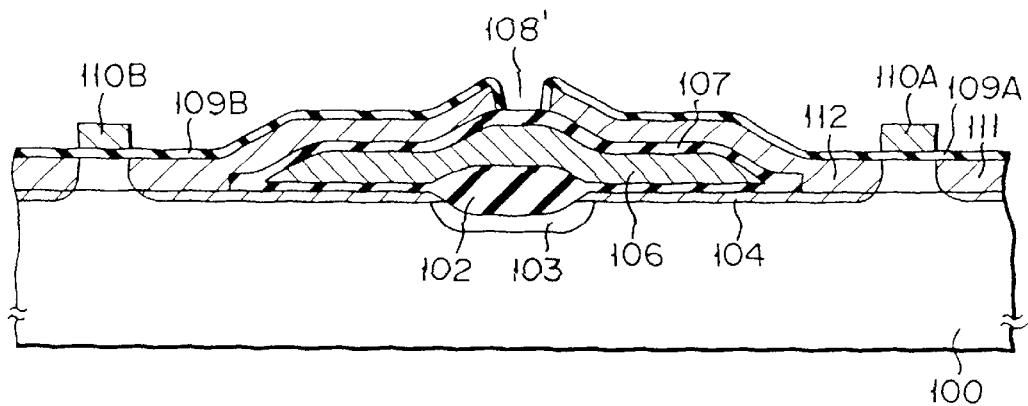

After this, a portion 108' formed on silicon oxide film 102 is so selectively etched out that element formed on the both sides of isolation region 108' are isolated with each other, as shown in FIG. 10D.

Further, third gate insulation films 109A and 109B are formed on silicon layer 108 for a thickness of 20 nm, for example. The surface of the resultant structure is covered with a polysilicon layer of 0.4 nm which is then patterned by means of a conventional process to form gate electrodes 110A and 10B. In FIG. 10D, the formed gate electrodes 110A and 110B are used as a mask for injecting arsenic ions into silicon layer 108 under an ion acceleration energy of 50 KeV and ion dozing rate of $5\times10^{15}$ $cm^{-2}$. As a result of this process, self aligned n+ layers 111A, 111B, 112A and 112B are formed in silicon layer 108 on both sides of gate electrodes 110A and 110B.

Figure 10E:
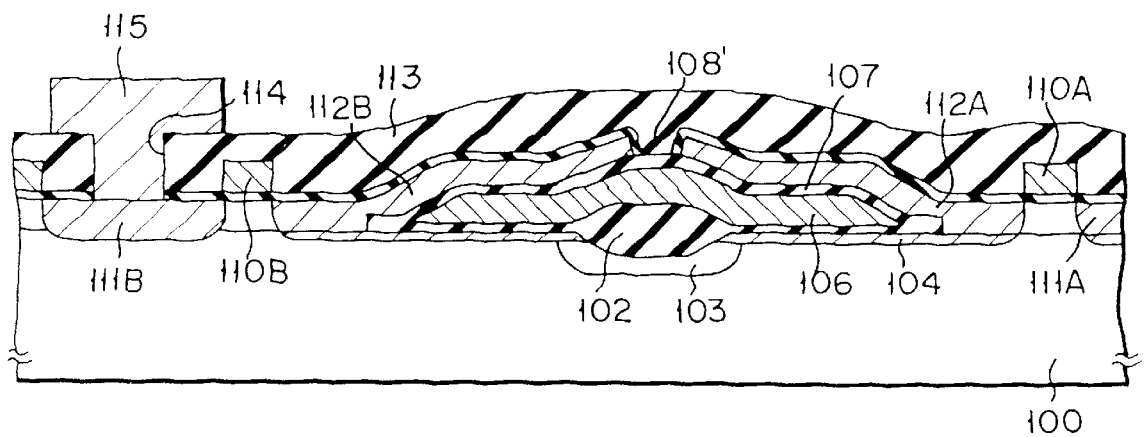

Finally, as shown in FIG. 10E, a conventional process of CVD method is used to form BPSG film 113 over the surface of the resultant structure of the process of FIG. 10D. A contact hole 114 is formed in BPSG film 113 at a portion corresponding to n+ region 111B and an aluminum layer 115 is deposited on BPSG film 113. This aluminum layer 115 is patterned to form a predetermined Al wiring.

The resultant structure shown in FIG. 10E has a DRAM cell structure in which polysilicon layer 106 acts as a cell plate electrodes, conductive region 104 and silicon layers 112A and 112B are used as charge storing layers, polysilicon gate electrodes 110A and 110B are used as word lines and Al layer 115 is used as a bit line of DRAM cell.

According to the embodiment of FIGS. 10A to 10E, a capacitor having a value twice as compared with that of the conventional structure is formed. This means that a high packing density can be realized according to the explained embodiment.

According to this invention as described above, there are provided the semiconductor device and the method for manufacturing the same in which a leakage can be prevented without increasing the cell area, and stable circuit operation can be obtained.

What is claimed is:

1. A static semiconductor memory comprising:

a first transistor formed on a semiconductor substrate, an insulating film formed on the first transistor except part of a gate electrode of said first transistor;

an epitaxial layer formed on the insulating film, an exposed portion of said gate electrode, and the semiconductor substrate separated from said first transistor, and a portion of a second transistor formed on a first portion of said epitaxial layer on said semiconductor substrate, wherein said first portion of said epitaxial layer is of a single crystalline structure, and a second portion of said epitaxial layer is of a polycrystalline structure on the insulating film, and said second portion of said epitaxial layer on the insulating film is used as a high resistance load element.

\* \* \* \* \*